United States Patent
Oh

[19]

[11] Patent Number: 5,982,703
[45] Date of Patent: Nov. 9, 1999

[54] SUPER HIGH-SPEED SEQUENTIAL COLUMN DECODER

[75] Inventor: Hak June Oh, Ichon-shi, Rep. of Korea

[73] Assignee: Hyundai Electronics Industries Co., Ltd., Kyoungki-do, Rep. of Korea

[21] Appl. No.: 09/211,285

[22] Filed: Dec. 16, 1998

[30] Foreign Application Priority Data

Dec. 31, 1997 [KR] Rep. of Korea ...................... 97-81303

[51] Int. Cl.⁶ ...................................................... G11C 8/00
[52] U.S. Cl. ................ 365/230.06; 365/236; 365/189.05
[58] Field of Search ......................... 365/230.06, 185.17, 365/194, 236, 189.05

[56] References Cited

U.S. PATENT DOCUMENTS

| | | | |
|---|---|---|---|
| 5,289,413 | 2/1994 | Tsuchida et al. | 365/189.02 |
| 5,703,830 | 12/1997 | Yasuhiro | 365/233 |
| 5,751,656 | 5/1998 | Schaefer | 365/233.5 |
| 5,777,943 | 7/1998 | Kim et al. | 365/230.06 |
| 5,777,945 | 7/1998 | Sim et al. | 365/230.06 |
| 5,848,024 | 12/1998 | Cho | 365/230.06 |

*Primary Examiner*—Trong Phan
*Assistant Examiner*—Thong Le
*Attorney, Agent, or Firm*—Gary M. Nath; Harold L. Novick; Nath & Associates

[57] ABSTRACT

A super high-speed sequential column decoder generates a high-speed successive output signals by using a pipe lining method and is operated irrespective of an applied speed of an external input clock signal, in a burst operation of a clock synchronous memory. The super high-speed sequential column decoder includes: a column address decoding portion which receives column address signals, decodes the column address signals, and transmits decoding signals to input terminals of a driving portion; and a pipeline-type column counter portion which has as many unit counters as burst-lengths, wherein, the unit counters receives the decoding signal as an input and sequentially generating column decoder signals. As a result, the super high-speed sequential column decoder freely adjusts a time delay, reduces a pulse width of the predecoding signals of an external column address, and thus drives the sequential column decoder signals at a high-speed frequency. In addition, the super high-speed sequential column decoder is operated irrespective of a speed of an external clock signal, thereby increasing the effectiveness of use.

11 Claims, 7 Drawing Sheets

SUPER HIGH-SPEED SEQUENTIAL COLUMN DECODER

BACKGROUND OF THE INVENTION

1. Field of the Invention

The present invention relates to a super high-speed sequential column decoder which adjusts a delay degree during a burst operation in a clock synchronous memory. More particularly, it relates to a super high-speed sequential column decoder which generates high-speed successive output signals by using a pipe lining method, and is, thus, operated irrespective of an applied speed of an external input clock signal.

2. Description of the Prior Art

In general, when a synchronous memory synchronized by an external input clock signal performs a burst operation, each column decoder's output is generated with an always synchronized clock signal. Accordingly, the time from an external clock signal to a column decoder output, which loads a bit-line data of a bit-line sense amplifier on a data bus line, becomes longer, wherein a bottle neck phenomenon occurs in the high-speed operation.

Figure 1:
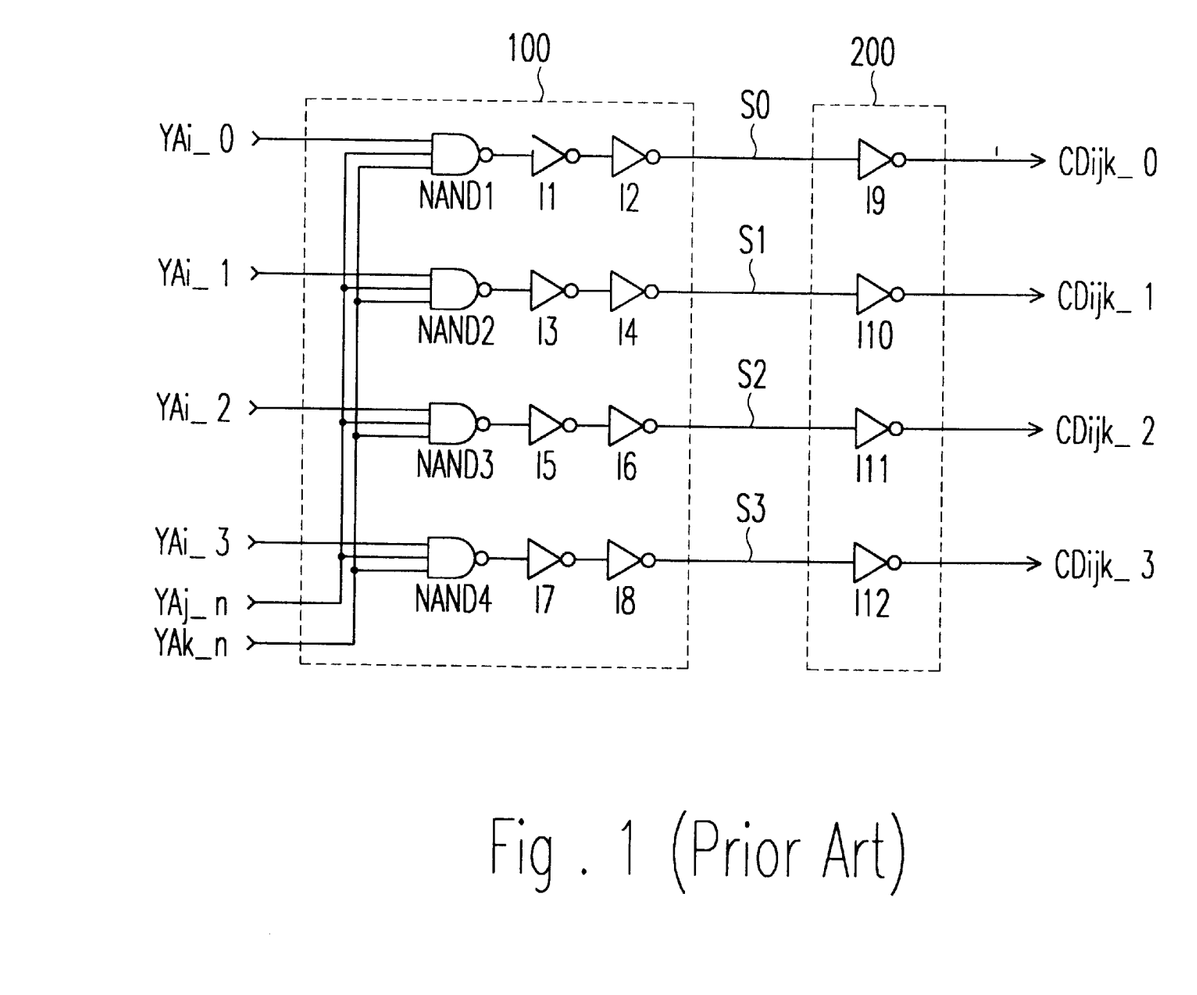
FIG. 1 is a circuit diagram of a conventional column decoder.

FIG. 1 is a circuit diagram of a conventional column decoder in which a burst-length is set to '4'.

Referring to FIG. 1, the conventional column decoder includes:

a column address decoding portion 100 which receives a plurality of predecoding signals of a column address as an input, decodes the signals, and transmits a plurality of decoding signals S0–S3 to a driving portion 200; and a driving portion 200 which receives the decoding signals S0–S3 as an input, is synchronized by a clock signal, and generates a plurality of column decoding signals CDijk_0–CDijk_3.

The column address decoding portion 100 includes:

three-input NAND gates NAND1–NAND4 which receive predecoding signals YAi_0–YAi_3 of a column address as a first input, and receive predecoding signals YAj_n and YAk_n of another column address as second and third inputs; and a plurality of buffering inverters I1–I8 which are connected to output nodes of the NAND gates NAND1–NAND4.

The driving portion 200 includes a plurality of inverters I9–I12 which receive the output signals S0–S3 of the column address decoding portion 100.

Although the present invention employs a structure used for a case of a burst-length '4' as an example, it can embody other case of burst-length '2' and '8', and a full page case of a burst-length '16' by using the same structure.

The signals YAi_0–YAi_3 which are input signals of the above column decoder can be an external input column address, and may be a predecoding signal of a column address generated by an internal counter.

However, since the signals YAi_0–YAi_3 are generated after being synchronized by a clock signal, their output signals CDijk_0–CDijk_3 are generated after being synchronized by the clock signal. Accordingly, a memory performing a sequential burst operation has a time limit in a high-speed burst operation.

Figure 2:
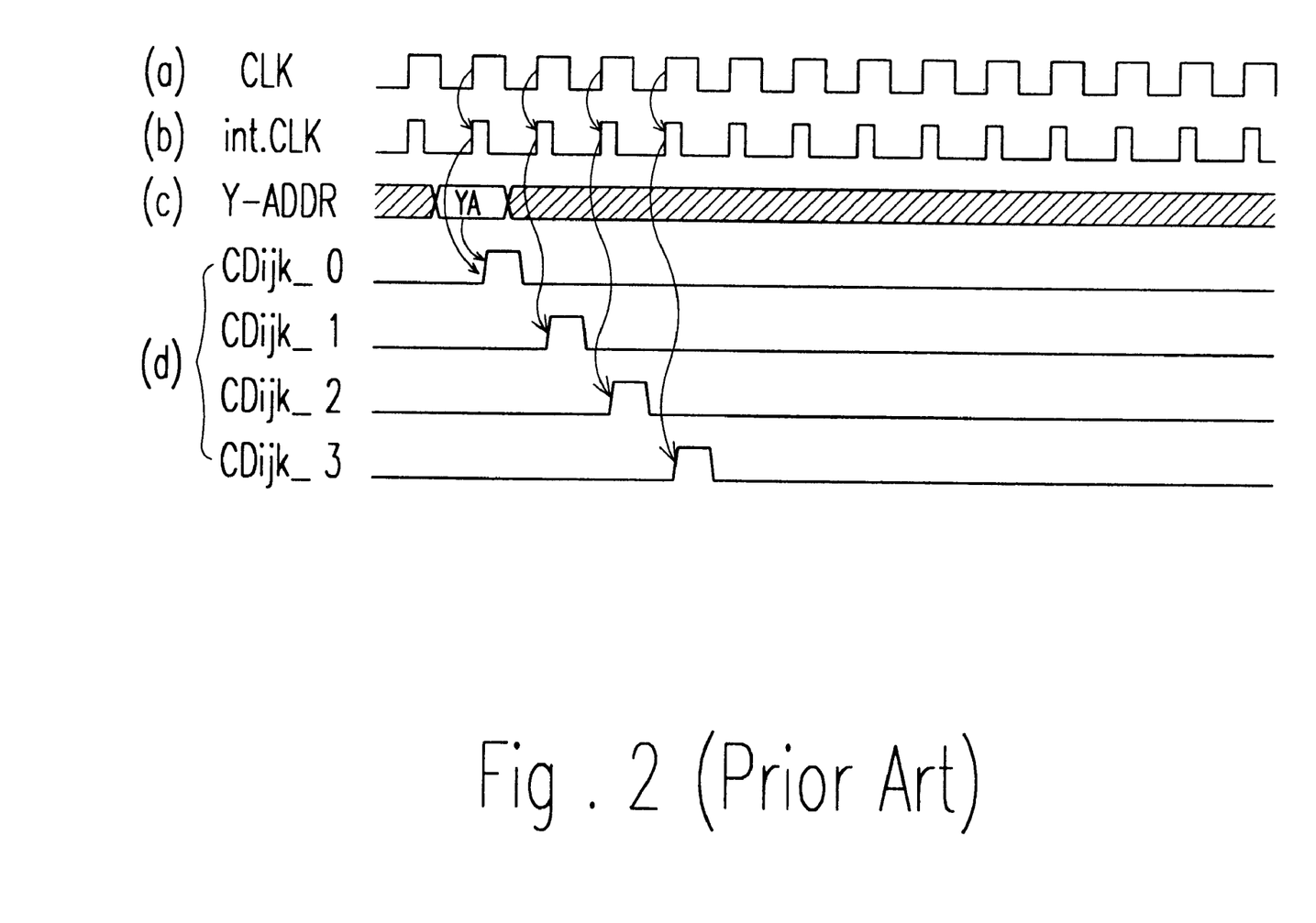
FIG. 2 is a timing diagram of a burst operation of a conventional clock synchronous memory.

FIG. 2 is a timing diagram of a burst operation of a conventional clock synchronous memory. Referring to FIG. 2, (a)CLK indicates an external input clock signal, (b)int_CLK indicates a clock signal generated in the inside of the conventional clock synchronous memory, (c)Y-ADDR indicates a column address signal, and (d)CDijk_0–CDijk_3 indicate each output signal of a column decoder.

In addition, i, j, and k indicate a predecoding combination of addresses.

As shown in FIG. 2, when performing a sequential burst operation, the conventional column decoder is synchronized by an external clock signal CLK, and sequentially generates four column decoder signals CDijk_0–CDijk_3 because of a burst-length '4'. Therefore, as a frequency of the external clock signal CLK rises, a time delay problem in a mutual communication line according to a circuit configuration or fabrication technique for producing the column decoder signal becomes serious.

SUMMARY OF THE INVENTION

Accordingly, the present invention is directed to a super high-speed sequential column decoder that substantially obviates one or more of the problems due to limitations and disadvantages of the related art.

It is an object of the present invention to provide a super high-speed sequential column decoder which reduces a successive column decoding time by using a pipe-line counter, adjusts a delay degree according to a clock frequency, and thus performs a high-speed burst operation.

To achieve the above object, a super high-speed sequential column decoder according to the present invention includes: a column address decoding portion which receives column address signals as an input, decodes the column address signals, and transmits decoding signals to input terminals of a driving portion; and a pipeline-type column counter portion which has a plurality of unit counters as many as a burst-length, the unit counters receiving the decoder signals as an input and sequentially generating column decoder signals.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 3:
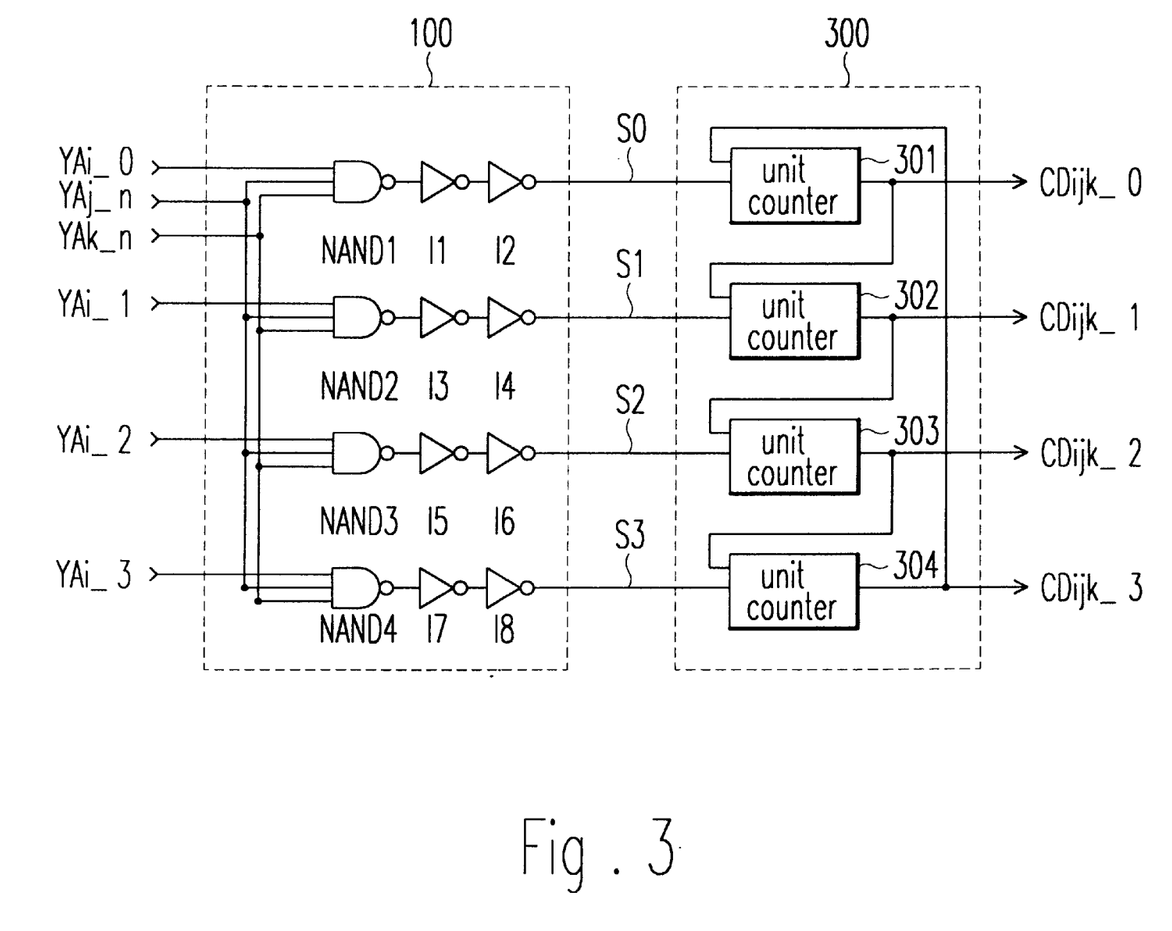
FIG. 3 is a circuit diagram of a super high-speed sequential column decoder according to the present invention.

FIG. 3 is a circuit diagram of a super high-speed sequential column decoder according to the present invention in which a burst-length is set to '4'.

As shown in FIG. 3, the super high-speed sequential column decoder includes: a column address decoding portion 100 which receives predecoding signals (YAi_0–YAi_3, YAj_n and YAk_n) of a column address as an input, decodes the signals (YAi_0–YAi_3, YAj_n and YAk_n), and transmits decoding signals S0–S3 to input terminals of a driving portion; and a pipeline-type column counter portion 300 which has as many unit counters 301–304 as burst-length, the unit counters 301–304 receiving the decoding signal S0–S3 as an input and sequentially generates column decoder signals CDijk_0CDijk_3.

The column address decoding portion 100 includes:

three-input NAND gates NAND1–NAND4 which receive predecoding signals YAi_0–YAi_3 of a column address as a first input, and receive predecoding signals YAj_n and YAk_n of another column address as second and third inputs, respectively; and a plurality of buffering inverters I1–I8 which are connected to output nodes of the NAND gates NAND1–NAND4.

Figure 4:
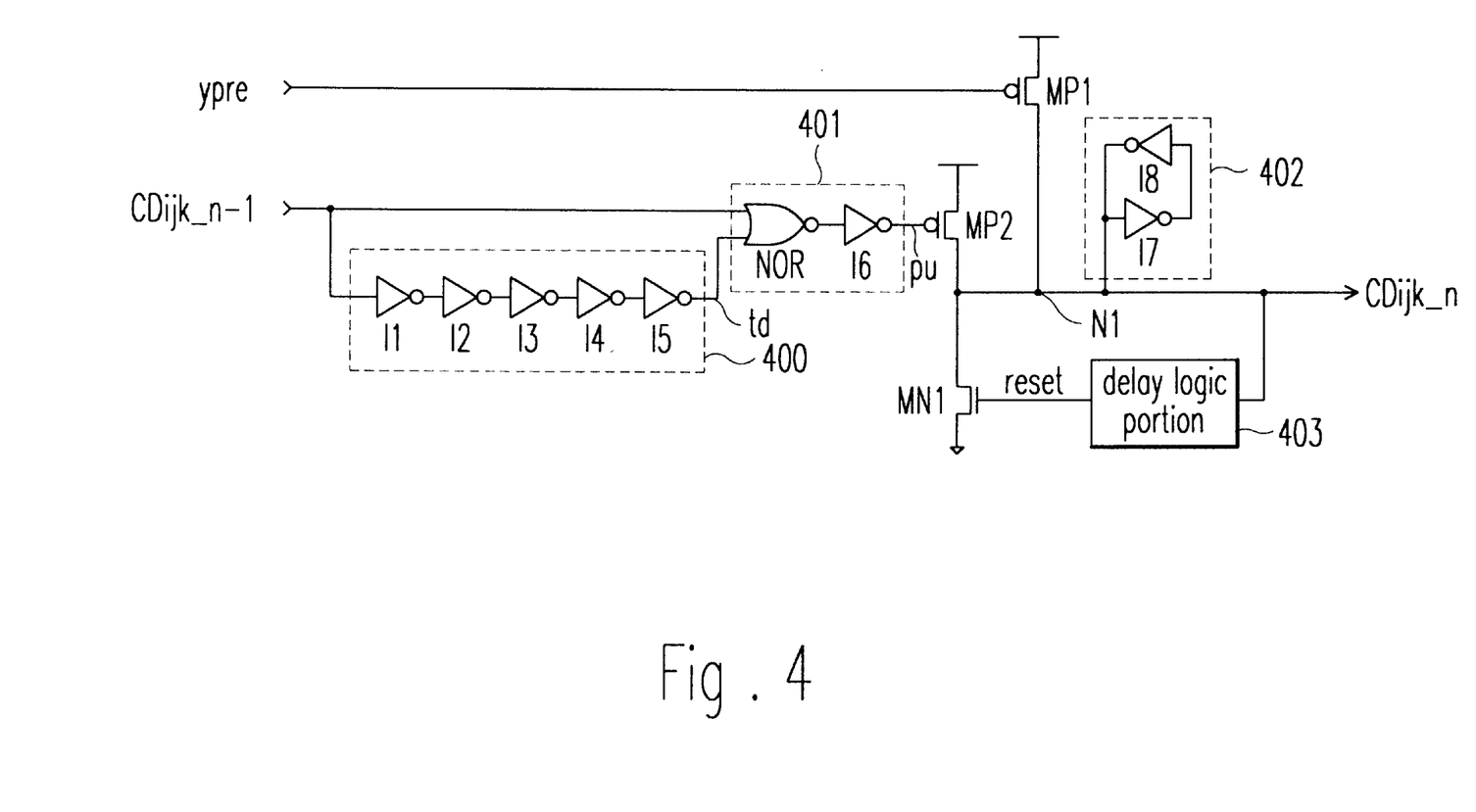
FIG. 4 is a detailed circuit diagram of a unit counter of FIG. 3 according to the present invention.

FIG. 4 is a detailed circuit diagram of unit counters 301–304 shown in FIG. 3.

As shown in FIG. 4, the unit counter includes: a first PMOS (P-channel metal oxide semiconductor) transistor MP1 which applies one signal ypre among the output signals S0–S3 of the column address decoding portion 100 to its gate terminal, and is connected between a power-supply potential and an output node N1; OR logic combination gate 401 which has a NOR gate NOR1 and an inverter I6, the NOR gate NOR1 receiving a signal td that an output signal CDijk_n-1 of a column decoder of a previous address passes through a buffering portion 400 having odd number inverters I1–I5 and is delayed by a predetermined time; a second PMOS transistor MP2 which applies an output signal pu of the OR logic combination gate 401 to its gate terminal, and is connected between the power-supply potential and the output node N1; a first NMOS (N-channel MOS) transistor MN1 which is connected between the output node N1 and a ground potential, and applies a signal reset which is an output signal generated after CDijk_n passes through a delay logic portion 403, thereafter the signal reset is fed back, to its gate terminal; and a latch portion 402 which has two inverters I7–I8 whose input/output terminals are commonly connected to latch a potential of the output node N1.

Figure 5:
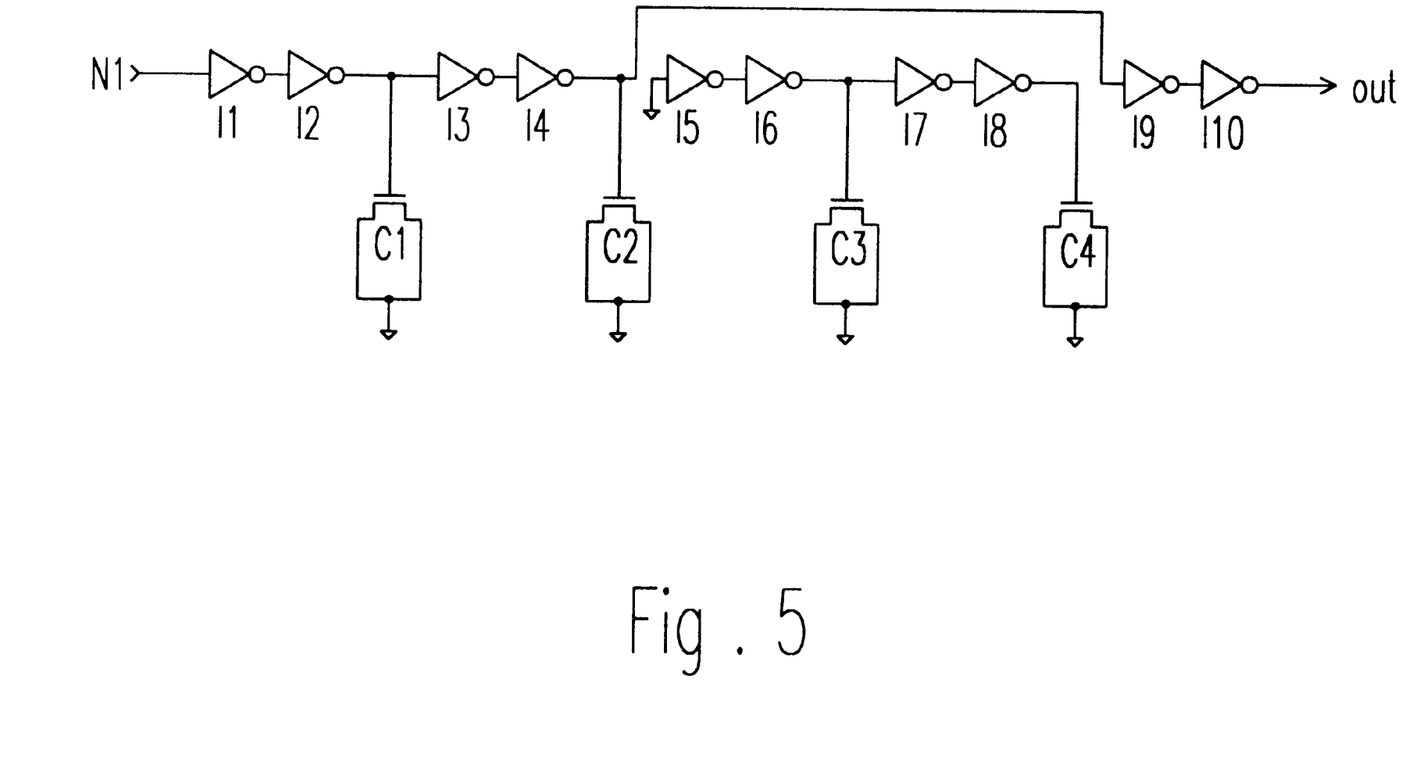
FIG. 5 is a circuit diagram of a delay logic portion of FIG. 4 according to the present invention.

FIG. 5 is a circuit diagram of a delay logic portion 403 of FIG. 4.

As shown in FIG. 5, a plurality of inverters I1–I0 are selectively connected by even numbers (e.g., by twos), wherein, a fuse option or a metal mask option is used between the partially-connected inverters, thereby adjusting a delay degree.

In addition, NMOS-type capacitors C1–C4 are respectively connected to output nodes of the inverter groups in series interconnected by two's. The delay logic portion 403 can be embodied as another circuit having an Input/Output characteristic of the same phase and the same amplitude.

The operations of the present invention will be described below with reference to the accompanying drawings.

Figure 6:
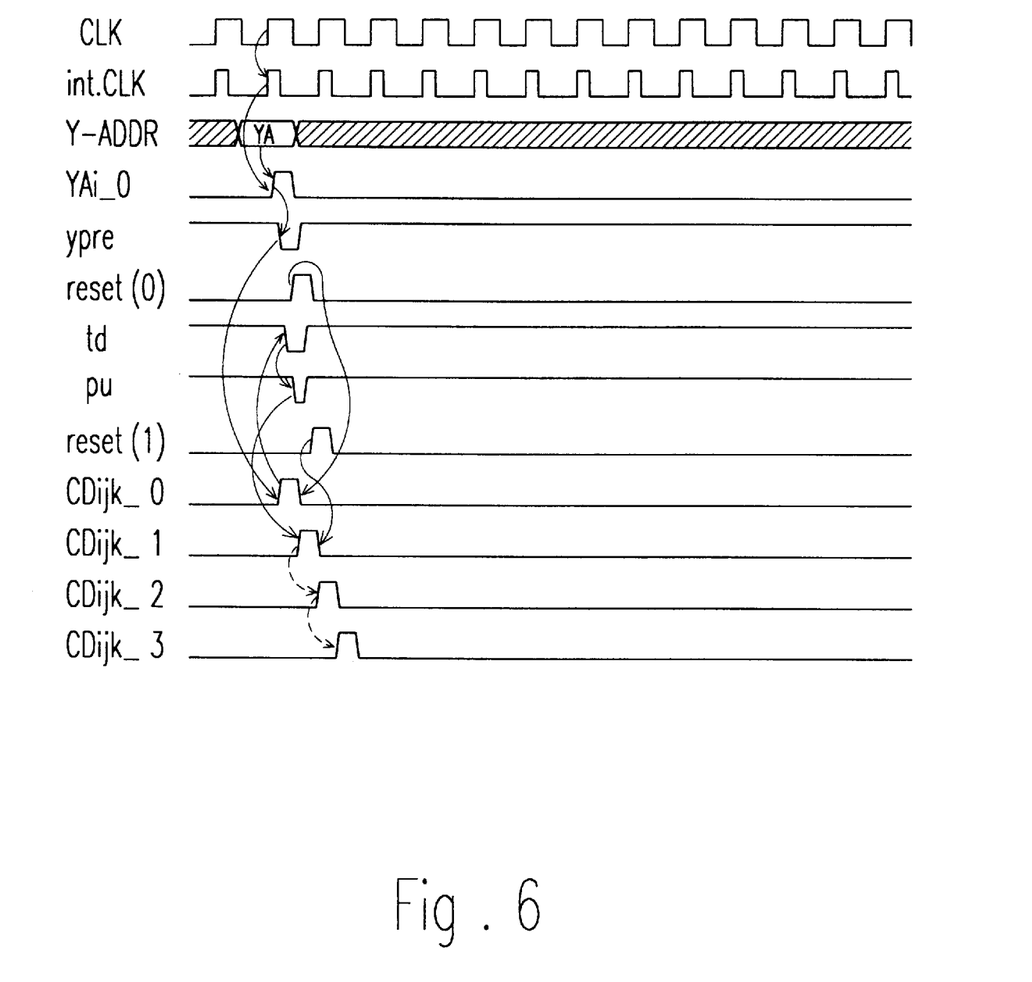
FIG. 6 is a timing diagram of the super high-speed sequential column decoder of FIG. 3 according to the present invention.

FIG. 6 is a timing diagram of the super high-speed sequential column decoder according to the present invention.

If the predecoding signals (YAi_0–YAi_3, YAj_n, and YAk_n) of a column address are a positive(+) pulse type, one signal ypre among the output signals S0–S3 of the column address decoding portion 100 becomes a negative(−) pulse, and the first PMOS transistor MP1 included in each of the unit counters 301–304 is turned on. Accordingly, an output signal CDijk_n of the unit counter becomes a logic high state, and the latch portion 402 maintains a high state. After the high state of the output signal CDijk_n is delayed by the delay logic portion 403, the first NMOS transistor MN1 whose gate terminal receives an output signal reset is turned on, and thus the output signal CDijk_n becomes a logic low state.

And, an output signal CDijk_n-1 of a column decoder of a previous address, in general, becomes a low state. An output signal td of the buffering portion 400 receiving the signal CDijk_n-1 as an input becomes a high state. And, an output signal pu of the OR logic gate 401 becomes a high state. Thus, the second PMOS transistor MP2 is generally turned off.

However, if the output signal CDijk_n-1 of the column decoder of the previous address is at a high state for a short time and is then changed to a low(−) pulse type, an output signal td of the buffering portion 400 cannot be changed from a low state to a high state. Two input signals of the OR logic gate 401 become a low state. And, the output signal pu becomes a low state. Thus, the second PMOS transistor MP2 is turned on.

The output signal CDijk_n becomes a high state by the second PMOS transistor MP2 turned on, and is delayed by the delay logic portion 403 for a predetermined time. The first NMOS transistor MN1 turned on by the signal reset of a high potential level makes the output signal CDijk_n of the unit counter be a logic low state, thereby generating a column decoding signal.

As described above, the unit counters 301–304 receive the predecoding signals S0–S3 of an external column address as an input, and make a first column decoder signal CDijk_0, make a second column decoder signal CDijk_1 by inputting the first column decoder signal CDijk_0 to a second unit counter, make a third column decoder signal CDijk_2 by inputting the second column decoder signal CDijk_1 to a third unit counter, and make a fourth column decoder signal CDijk_3 by inputting the third column decoder signal CDijk_2 to a fourth unit counter. Finally, the fourth column decoder signal CDijk_3 is inputted into the first unit counter. In this manner, the above operations are repeated.

Figure 7:
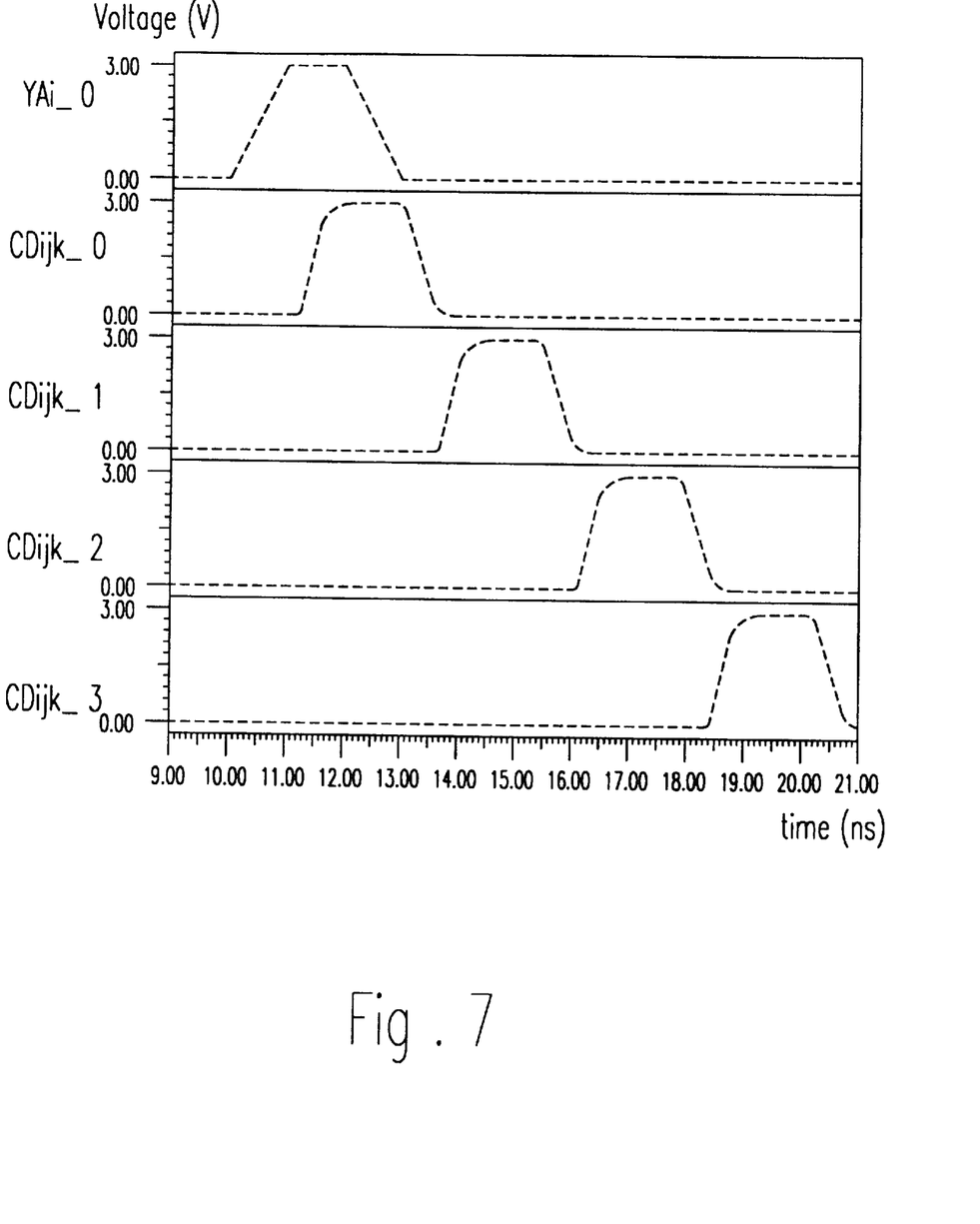
FIG. 7 illustrates a simulation result of the super high-speed sequential column decoder of FIG. 3 according to the present invention.

FIG. 7 illustrates a simulation result of the super high-speed sequential column decoder of FIG. 3 according to the present invention.

As described above, a super high-speed sequential column decoder according to the present invention adjusts a time delay by using a delay logic portion, reducing the pulse width of the predecoding signals of an external column address, and thus, driving the sequential column decoder signals at a high-speed frequency.

In addition, the super high-speed sequential column decoder is operated irrespective of a speed of an external clock signal, thereby increasing a practicability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A super high-speed sequential column decoder, comprising:

a column address decoding portion which receives column address signals as an input, decodes the column address signals, and transmits decoding signals to input terminals of a driving portion; and a pipeline-type column counter portion which has as many unit counters as burst-lengths, wherein each of the unit counters receive the corresponding decoding signal and the output from the preceding unit counter as an input and sequentially generating column decoder signals, and each of the unit counters includes a reset element which controls the pulse width of the output signal from the unit counter itself.

2. The super high-speed sequential column decoder as set forth in claim 1, wherein the column address decoding portion includes:

a plurality of logic gates which equal the number of burst-lengths, receive as many predecoding signals of column addresses as burst-lengths for the first input, and receive a plurality of predecoding signals of another column address as second and third inputs; and a first buffering element connected to each output node of the plurality of logic gates, wherein the logic gates are embodied as a NAND gate, and the first buffering element is embodied as a plurality of inverters interconnected in series.

3. The super high-speed sequential column decoder as set forth in claim 1, wherein the unit counter includes:

a first switching element which receives one output signal from the column address decoding portion as an input and selectively transmits a power-supply potential to an output node according to the potential level of the received signal;

a latch element for latching a potential of the output node;

a first logic gate which receives an output signal from a column decoder of a previous address and another signal which is the output signal delayed for a predetermined time after passing a second buffering element;

a second switching element which receives an output signal of the first logic gate as an input and selectively transmits a power-supply potential to the output node according to the potential level of the output signal;

a delay element which receives a potential of the output node as an input and delays it for a predetermined time; and the reset element which receives an output signal of the delay element as an input and is connected between the second switching element and ground potential.

4. The super high-speed sequential column decoder as set forth in claim 3, wherein the first and second switching elements are embodied as a metal oxide semiconductor (MOS) transistor, and wherein the latch elements are embodied as two inverters whose input/output terminals are commonly connected.

5. The super high-speed sequential column decoder as set forth in claim 3, wherein the second buffering element is embodied as odd number inverters connected in series therebetween.

6. The super high-speed sequential column decoder as set forth in claim 3, wherein the first logic gate is embodied as OR gate.

7. The super high-speed sequential column decoder as set forth in claim 3, wherein the delay element has Input/Output characteristics of the same phase and amplitude.

8. The super high-speed sequential column decoder as set forth in claim 3, wherein the reset element is embodied as a metal oxide semiconductor (MOS) transistor.

9. The super high-speed sequential column decoder as set forth in claim 3, wherein the delay element includes:

a plurality of inverters which are connected by even numbers, and make a plurality of inverter groups; and a plurality of capacitors which are respectively connected between a connection node of each inverter group and ground potential.

10. The super high-speed sequential column decoder as set forth in claim 9, wherein the plurality of inverter groups are selectively connected by using a fuse option in order to adjust a delay degree.

11. The super high-speed sequential column decoder as set forth in claim 9, wherein the plurality of inverter groups are selectively connected by using a metal mask option in order to adjust a delay degree.

* * * * *